United States Patent
Matsuura et al.

(10) Patent No.: US 11,308,248 B2
(45) Date of Patent: Apr. 19, 2022

(54) APPARATUS AND METHOD FOR QUANTUM COMPUTING PERFORMANCE SIMULATION

(71) Applicant: Intel Corporation, Santa Clara, CA (US)

(72) Inventors: Anne Matsuura, Portland, OR (US); Sonika Johri, Portland, OR (US); Justin Hogaboam, Aloha, OR (US)

(73) Assignee: Intel Corporation, Santa Clara, CA (US)

( * ) Notice: Subject to any disclaimer, the term of this patent is extended or adjusted under 35 U.S.C. 154(b) by 817 days.

(21) Appl. No.: 15/972,119

(22) Filed: May 5, 2018

(65) Prior Publication Data

US 2019/0042677 A1    Feb. 7, 2019

(51) Int. Cl.
   *G06F 30/20*      (2020.01)
   *G06N 10/00*      (2022.01)

(52) U.S. Cl.
   CPC ............. *G06F 30/20* (2020.01); *G06N 10/00* (2019.01)

(58) Field of Classification Search
   CPC .......... G06F 30/20; G06F 30/00; G06N 10/00
   USPC ..................................................... 703/21, 13
   See application file for complete search history.

(56) References Cited

U.S. PATENT DOCUMENTS

| | | | |
|---|---|---|---|
| 10,592,216 B1 * | 3/2020 | Richardson | G06F 8/60 |
| 2005/0273306 A1 | 12/2005 | Hilton et al. | |
| 2008/0140749 A1 | 6/2008 | Amato et al. | |
| 2016/0071021 A1 * | 3/2016 | Raymond | G06N 10/00 712/28 |
| 2017/0177534 A1 | 6/2017 | Mohseni et al. | |
| 2017/0228483 A1 | 8/2017 | Rigetti et al. | |
| 2017/0286858 A1 * | 10/2017 | La Cour | G06F 7/50 |
| 2017/0300454 A1 | 10/2017 | Maassen et al. | |
| 2018/0096085 A1 | 4/2018 | Rubin | |
| 2018/0308000 A1 * | 10/2018 | Dukatz | G06N 20/00 |

OTHER PUBLICATIONS

Reilly, David J. "Engineering the Quantum-Classical Interface of Solid-State Qubits", Oct. 27, 2015, Quantum Information. (Year : 2015).*

Veldhorst, M. et al., "Silicon CMOS Architecture for a Spin-Based Quantum Computer", Dec. 15, 2017, Nature Communications. (Year: 2017).*

(Continued)

*Primary Examiner* — Cedric Johnson
(74) *Attorney, Agent, or Firm* — Nicholson De Vos Webster & Elliott LLP

(57) ABSTRACT

Apparatus and method for a full quantum system simulator. For example, one embodiment of a method comprises: initializing a quantum computing system simulator for simulating multiple layers of a quantum system including one or more non-quantum layers and one or more physical quantum device layers of the quantum system; simulating a first set of operations of the one or more non-quantum layers of the quantum system to generate first simulation results; simulating a second set of operations of the one or more quantum device layers of the quantum system to generate second simulation results; analyzing the first and second simulation results to provide at least one configuration recommendation for the quantum system.

27 Claims, 12 Drawing Sheets

(56) References Cited

OTHER PUBLICATIONS

International Search Report and Written Opinion for Application No. PCT/US2019/026191, dated Jul. 12, 2019, 10 pages.
International Preliminary Reporton Patentability, PCT App. No. PCT/US2019/026191, dated Nov. 19, 2020, 7 pages.
European Search Report and Search Opinion, EP App. No. 19799677.0, dated Jan. 21, 2022, 7 pages.

* cited by examiner

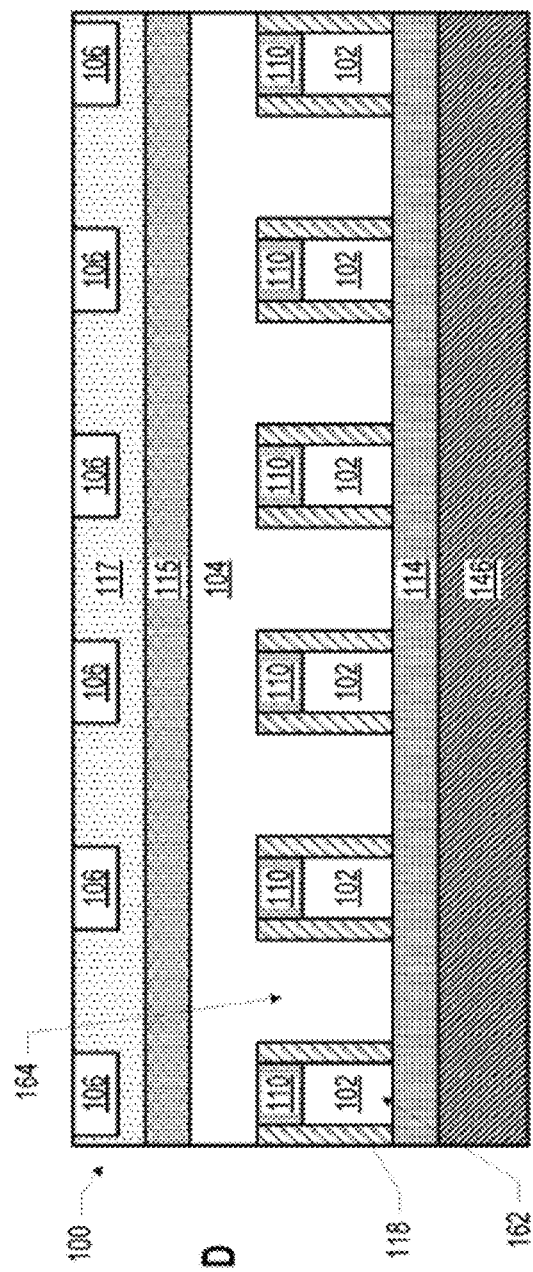
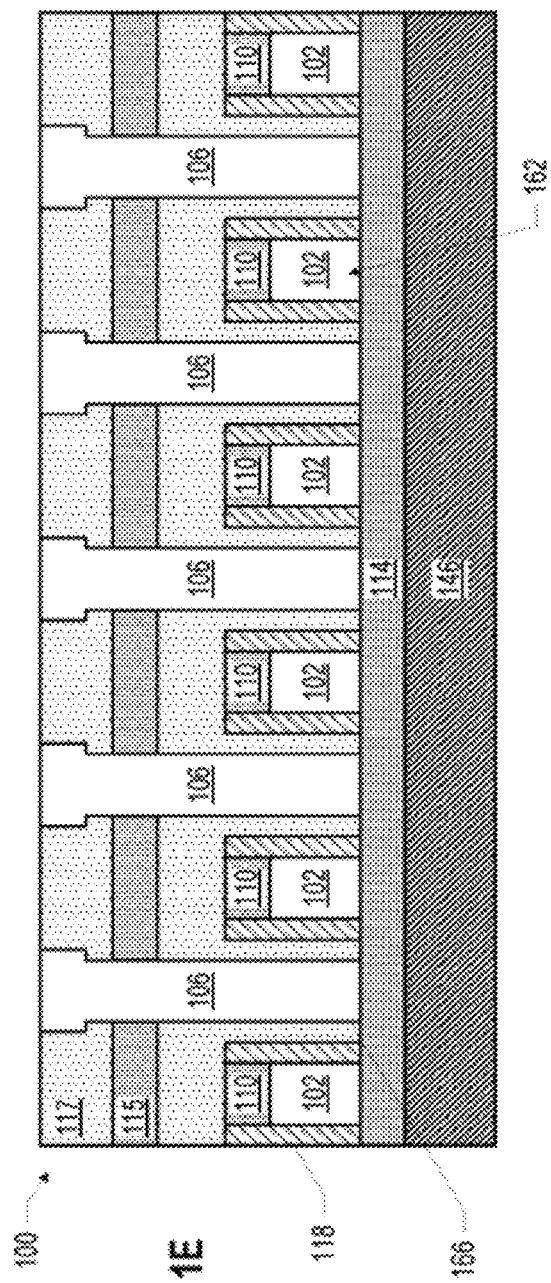

APPARATUS AND METHOD FOR QUANTUM COMPUTING PERFORMANCE SIMULATION

BACKGROUND

Field of the Invention

The embodiments of the invention relate generally to the field of quantum computing. More particularly, these embodiments relate to an apparatus and method for quantum computing performance simulation.

Description of the Related Art

Quantum computing refers to the field of research related to computation systems that use quantum mechanical phenomena to manipulate data. These quantum mechanical phenomena, such as superposition (in which a quantum variable can simultaneously exist in multiple different states) and entanglement (in which multiple quantum variables have related states irrespective of the distance between them in space or time), do not have analogs in the world of classical computing, and thus cannot be implemented with classical computing devices.

BRIEF DESCRIPTION OF THE DRAWINGS

A better understanding of the present invention can be obtained from the following detailed description in conjunction with the following drawings, in which:

FIGS. 1A-1F illustrate various views of an example quantum dot device, in accordance with one embodiment;

DETAILED DESCRIPTION

Figure 1A:
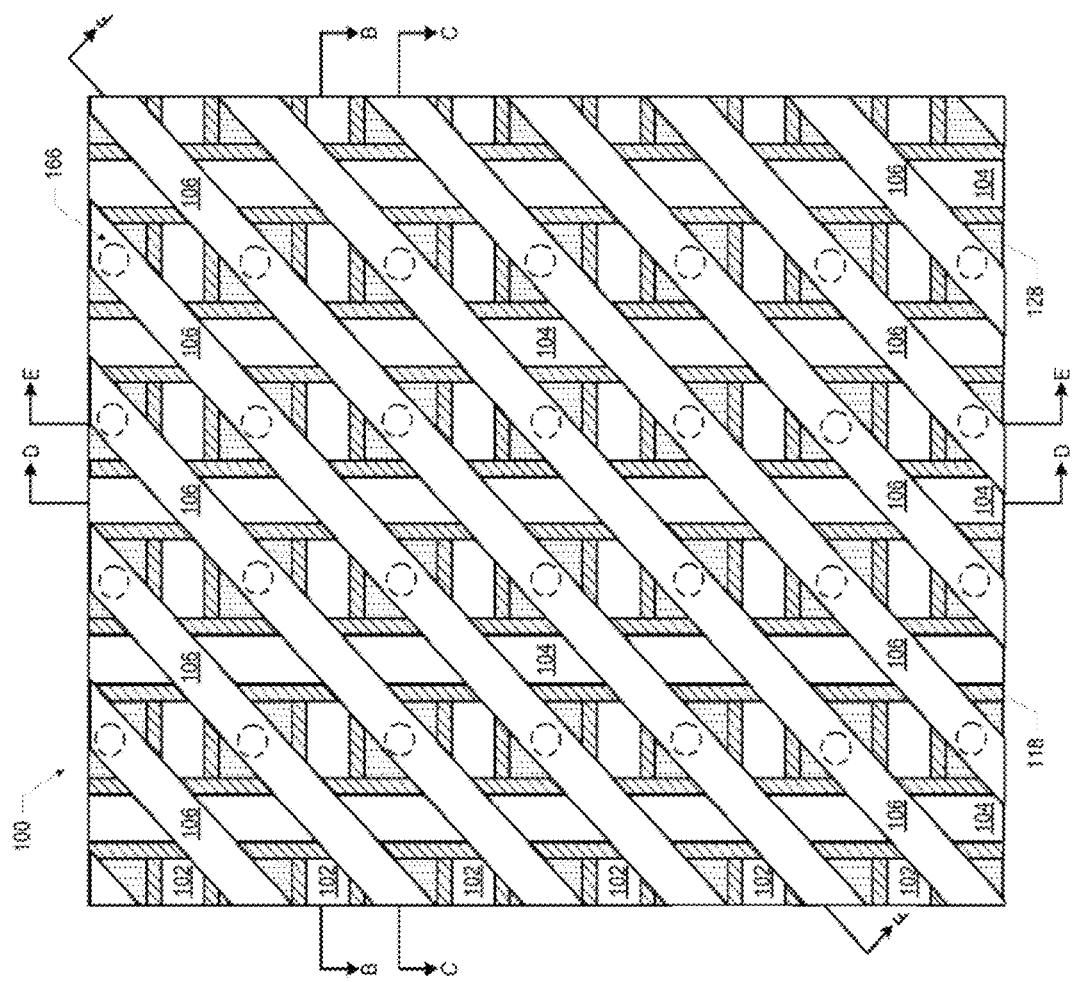

In the following description, for the purposes of explanation, numerous specific details are set forth in order to provide a thorough understanding of the embodiments of the invention described below. It will be apparent, however, to one skilled in the art that the embodiments of the invention may be practiced without some of these specific details. In other instances, well-known structures and devices are shown in block diagram form to avoid obscuring the underlying principles of the embodiments of the invention.

Introduction

A quantum computer uses quantum-mechanical phenomena such as superposition and entanglement to perform computations. In contrast to digital computers which store data in one of two definite states (0 or 1), quantum computation uses quantum bits (qubits), which can be in superpositions of states. Qubits may be implemented using physically distinguishable quantum states of elementary particles such as electrons and photons. For example, the polarization of a photon may be used where the two states are vertical polarization and horizontal polarization. Similarly, the spin of an electron may have distinguishable states such as "up spin" and "down spin."

Qubit states are typically represented by the bracket notations $|0\rangle$ and $|1\rangle$. In a traditional computer system, a bit is exclusively in one state or the other, i.e., a '0' or a '1.' However, qubits in quantum mechanical systems can be in a superposition of both states at the same time, a trait that is unique and fundamental to quantum computing.

Quantum computing systems execute algorithms containing quantum logic operations performed on qubits. The sequence of operations is statically compiled into a schedule and the qubits are addressed using an indexing scheme. This algorithm is then executed a sufficiently large number of times until the confidence interval of the computed answer is above a threshold (e.g., ~95+%). Hitting the threshold means that the desired algorithmic result has been reached.

Qubits have been implemented using a variety of different technologies which are capable of manipulating and reading quantum states. These include, but are not limited to quantum dot devices (spin based and spatial based), trapped-ion devices, superconducting quantum computers, optical lattices, nuclear magnetic resonance computers, solid-state NMR Kane quantum devices, electrons-on-helium quantum computers, cavity quantum electrodynamics (CQED) devices, molecular magnet computers, and fullerene-based ESR quantum computers, to name a few. Thus, while a quantum dot device is described below in relation to certain embodiments of the invention, the underlying principles of the invention may be employed in combination with any type of quantum computer including, but not limited to, those listed above. The particular physical implementation used for qubits is orthogonal to the embodiments of the invention described herein.

Quantum Dot Devices

Quantum dots are small semiconductor particles, typically a few nanometers in size. Because of this small size, quantum dots operate according to the rules of quantum mechanics, having optical and electronic properties which differ from macroscopic entities. Quantum dots are sometimes referred to as "artificial atoms" to connote the fact that a quantum dot is a single object with discrete, bound electronic states, as is the case with atoms or molecules.

Figure 1B:
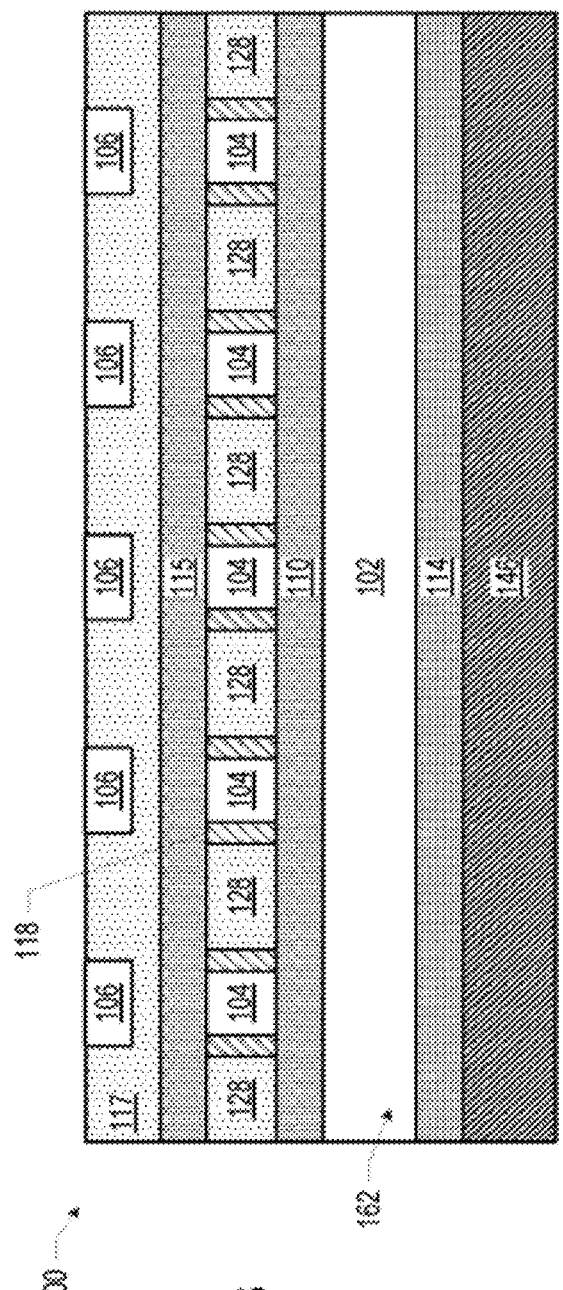
Figure 1C:
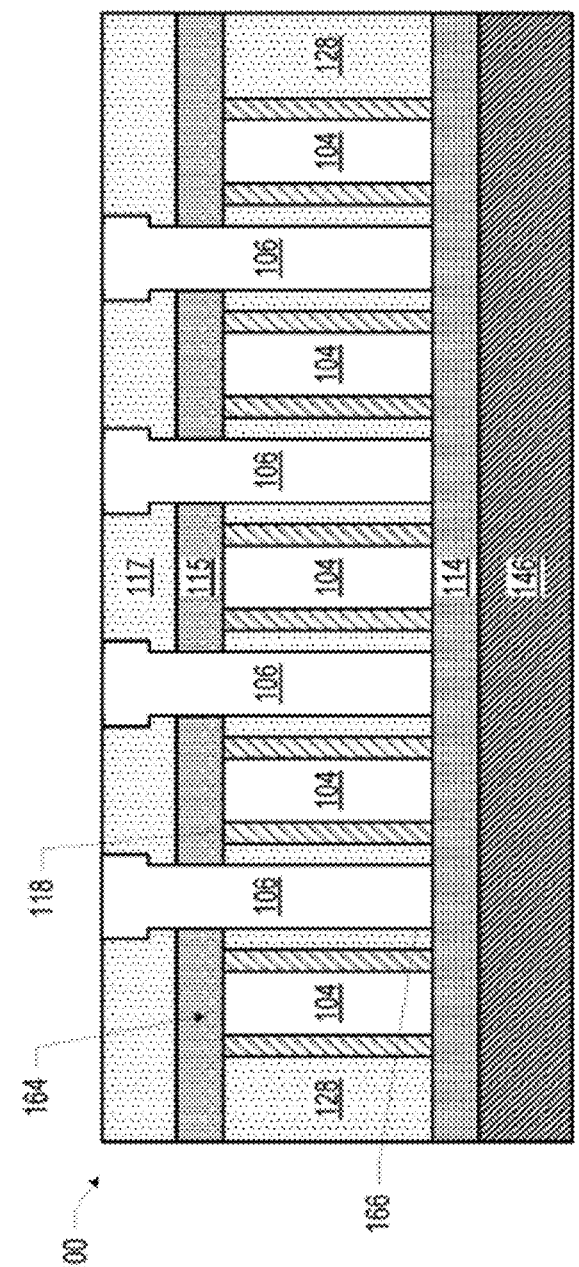
Figure 1F:
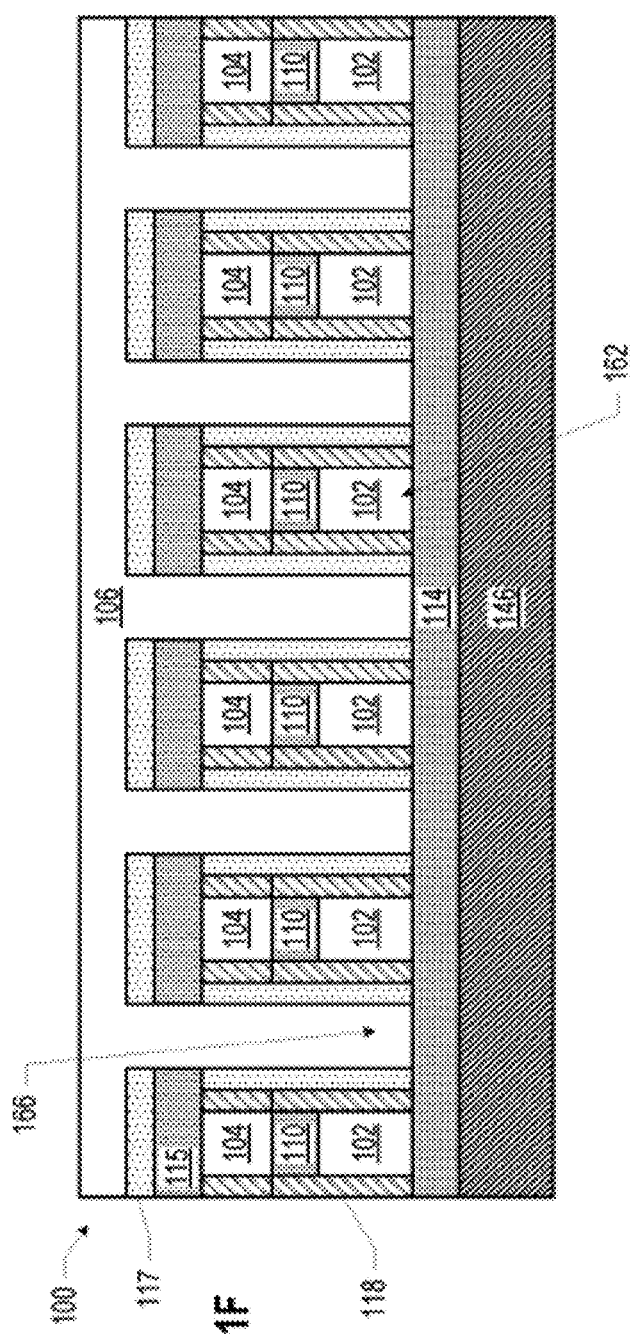

FIGS. 1A-1F are various views of a quantum dot device 100, which may be used with embodiments of the invention described below. FIG. 1A is a top view of a portion of the quantum dot device 100 with some of the materials removed so that the first gate lines 102, the second gate lines 104, and the third gate lines 106 are visible. Although many of the drawings and description herein may refer to a particular set of lines or gates as "barrier" or "quantum dot" lines or gates, respectively, this is simply for ease of discussion, and in other embodiments, the role of "barrier" and "quantum dot" lines and gates may be switched (e.g., barrier gates may instead act as quantum dot gates, and vice versa). FIGS. 1B-1F are side cross-sectional views of the quantum dot device 100 of FIG. 1A; in particular, FIG. 1B is a view through the section B-B of FIG. 1A, FIG. 1C is a view through the section C-C of FIG. 1A, FIG. 1D is a view through the section D-D of FIG. 1A, FIG. 1E is a view through the section E-E of FIG. 1A, and FIG. 1F is a view through the section F-F of FIG. 1A.

The quantum dot device 100 of FIG. 1 may be operated in any of a number of ways. For example, in some embodiments, electrical signals such as voltages, currents, radio frequency (RF), and/or microwave signals, may be provided to one or more first gate line 102, second gate line 104, and/or third gate line 106 to cause a quantum dot (e.g., an electron spin-based quantum dot or a hole spin-based quantum dot) to form in a quantum well stack 146 under a third gate 166 of a third gate line 106. Electrical signals provided to a third gate line 106 may control the electrical potential of a quantum well under the third gates 166 of that third gate line 106, while electrical signals provided to a first gate line 102 (and/or a second gate line 104) may control the potential energy barrier under the first gates 162 of that first gate line 102 (and/or the second gates 164 of that second gate line 104) between adjacent quantum wells. Quantum interactions between quantum dots in different quantum wells in the quantum well stack 146 (e.g., under different quantum dot gates) may be controlled in part by the potential energy barrier provided by the barrier potentials imposed between them (e.g., by intervening barrier gates).

Generally, the quantum dot devices 100 disclosed herein may further include a source of magnetic fields (not shown) that may be used to create an energy difference in the states of a quantum dot (e.g., the spin states of an electron spin-based quantum dot) that are normally degenerate, and the states of the quantum dots (e.g., the spin states) may be manipulated by applying electromagnetic energy to the gates lines to create quantum bits capable of computation. The source of magnetic fields may be one or more magnet lines, as discussed below. Thus, the quantum dot devices 100 disclosed herein may, through controlled application of electromagnetic energy, be able to manipulate the position, number, and quantum state (e.g., spin) of quantum dots in the quantum well stack 146.

In the quantum dot device 100 of FIG. 1, a gate dielectric 114 may be disposed on a quantum well stack 146. A quantum well stack 146 may include at least one quantum well layer 152 (not shown in FIG. 1) in which quantum dots may be localized during operation of the quantum dot device 100. The gate dielectric 114 may be any suitable material, such as a high-k material. Multiple parallel first gate lines 102 may be disposed on the gate dielectric 114, and spacer material 118 may be disposed on side faces of the first gate lines 102. In some embodiments, a patterned hardmask 110 may be disposed on the first gate lines 102 (with the pattern corresponding to the pattern of the first gate lines 102), and the spacer material 118 may extend up the sides of the hardmask 110, as shown. The first gate lines 102 may each be a first gate 162. Different ones of the first gate lines 102 may be electrically controlled in any desired combination (e.g., each first gate line 102 may be separately electrically controlled, or some or all the first gate lines 102 may be shorted together in one or more groups, as desired).

Multiple parallel second gate lines 104 may be disposed over and between the first gate lines 102. As illustrated in FIG. 1, the second gate lines 104 may be arranged perpendicular to the first gate lines 102. The second gate lines 104 may extend over the hardmask 110, and may include second gates 164 that extend down toward the quantum well stack 146 and contact the gate dielectric 114 between adjacent ones of the first gate lines 102, as illustrated in FIG. 1D. In some embodiments, the second gates 164 may fill the area between adjacent ones of the first gate lines 102/spacer material 118 structures; in other embodiments, an insulating material (not shown) may be present between the first gate lines 102/spacer material 118 structures and the proximate second gates 164. In some embodiments, spacer material 118 may be disposed on side faces of the second gate lines 104; in other embodiments, no spacer material 118 may be disposed on side faces of the second gate lines 104. In some embodiments, a hardmask 115 may be disposed above the second gate lines 104. Multiple ones of the second gates 164 of a second gate line 104 are electrically continuous (due to the shared conductive material of the second gate line 104 over the hardmask 110). Different ones of the second gate lines 104 may be electrically controlled in any desired combination (e.g., each second gate line 104 may be separately electrically controlled, or some or all the second gate lines 104 may be shorted together in one or more groups, as desired). Together, the first gate lines 102 and the second gate lines 104 may form a grid, as depicted in FIG. 1.

Multiple parallel third gate lines 106 may be disposed over and between the first gate lines 102 and the second gate lines 104. As illustrated in FIG. 1, the third gate lines 106 may be arranged diagonal to the first gate lines 102, and diagonal to the second gate lines 104. In particular, the third gate lines 106 may be arranged diagonally over the openings in the grid formed by the first gate lines 102 and the second gate lines 104. The third gate lines 106 may include third gates 166 that extend down to the gate dielectric 114 in the openings in the grid formed by the first gate lines 102 and the second gate lines 104; thus, each third gate 166 may be bordered by two different first gate lines 102 and two different second gate lines 104. In some embodiments, the third gates 166 may be bordered by insulating material 128; in other embodiments, the third gates 166 may fill the openings in the grid (e.g., contacting the spacer material 118 disposed on side faces of the adjacent first gate lines 102 and the second gate lines 104, not shown). Additional insulating material 117 may be disposed on and/or around the third gate lines 106. Multiple ones of the third gates 166 of a third gate line 106 are electrically continuous (due to the shared conductive material of the third gate line 106 over the first gate lines 102 and the second gate lines 104). Different ones of the third gate lines 106 may be electrically controlled in any desired combination (e.g., each third gate line 106 may be separately electrically controlled, or some or all the third gate lines 106 may be shorted together in one or more groups, as desired).

Although FIGS. 1A-F illustrate a particular number of first gate lines 102, second gate lines 104, and third gate lines 106, this is simply for illustrative purposes, and any number of first gate lines 102, second gate lines 104, and third gate lines 106 may be included in a quantum dot device 100. Other examples of arrangements of first gate lines 102, second gate lines 104, and third gate lines 106 are possible. Electrical interconnects (e.g., vias and conductive lines) may contact the first gate lines 102, second gate lines 104, and third gate lines 106 in any desired manner.

Not illustrated in FIG. 1 are accumulation regions that may be electrically coupled to the quantum well layer of the quantum well stack 146 (e.g., laterally proximate to the quantum well layer). The accumulation regions may be spaced apart from the gate lines by a thin layer of an intervening dielectric material. The accumulation regions may be regions in which carriers accumulate (e.g., due to doping, or due to the presence of large electrodes that pull carriers into the quantum well layer), and may serve as reservoirs of carriers that can be selectively drawn into the areas of the quantum well layer under the third gates 166 (e.g., by controlling the voltages on the quantum dot gates, the first gates 162, and the second gates 164) to form carrier-based quantum dots (e.g., electron or hole quantum dots, including a single charge carrier, multiple charge carriers, or no charge carriers). In other embodiments, a quantum dot device 100 may not include lateral accumulation regions, but may instead include doped layers within the quantum well stack 146. These doped layers may provide the carriers to the quantum well layer. Any combination of accumulation regions (e.g., doped or non-doped) or doped layers in a quantum well stack 146 may be used in any of the embodiments of the quantum dot devices 100 disclosed herein.

Apparatus and Method for Quantum Computing Performance Simulation

Classical computing has benefitted from 50+ years of technology advancement to aid in the design and development of new computing architectures. Simulation tools have been critical to the rapid development of modern classical computing designs. Such simulation tools are used for the design, benchmarking, and performance analysis of the new architectures along critical metrics. Along with the advancement of Moore's Law at the device and transistor layer, similar advances in algorithms and hardware technologies have pushed the frontier of classical computing ever forward.

Simulation tools to accurately simulate entire quantum computing systems are unavailable. Design space exploration is performed either at the algorithm and quantum logical circuit level or on benchmarks related to the performance of the quantum bits themselves (e.g., qubit lifetime, control fidelity, qubit connectivity, absolute number of qubits available, etc.). These benchmarks are used to compare quantum bit technologies but do not provide meaningful information related to the performance of an overall quantum computing system, either from an algorithmic or a system design perspective.

One embodiment of the invention simulates a full quantum computer system design from the compiler and quantum runtime to the control electronics and individual qubit devices in order to move designs towards more robust and usable quantum computers. Because quantum computers rely on fundamentally different physical processes existing classical simulation technologies cannot be leveraged alone. For example, there is no classical computing equivalent for phenomenon such as superposition of qubit states and quantum entanglement. These are not easily simulated classically and require a different approach.

One embodiment of the invention comprises a complete, multi-layer simulator for a quantum computer system comprising an individual simulation component (e.g., software modules and/or circuitry) for every layer of the quantum computer. Each layer has a cleanly defined interface, implemented in software, hardware, or any combination thereof, that can be adapted for qubit control and device behavior. For example, one simulation component may simulate the I/O, a second may simulate the timing, and a third may simulate interfaces of a full quantum computer prior to hardware availability.

Significantly, in one embodiment, the simulation components are designed to allow the seamless replacement of the components with real functioning hardware. By way of example, and not limitation, the use of the real device Hamiltonian describing the behavior of the qubit under different quantum control regimes is employed as well as the interconnectivity and performance expected from the real manufactured device. Different embodiments may be implemented using different quantum technologies such as Ion Traps, Neutral Atoms, and Cavity quantum electrodynamics (cQED) devices. It should be noted, however, that the underlying principles of the invention are not limited to any particular quantum computing technology.

Figure 2:
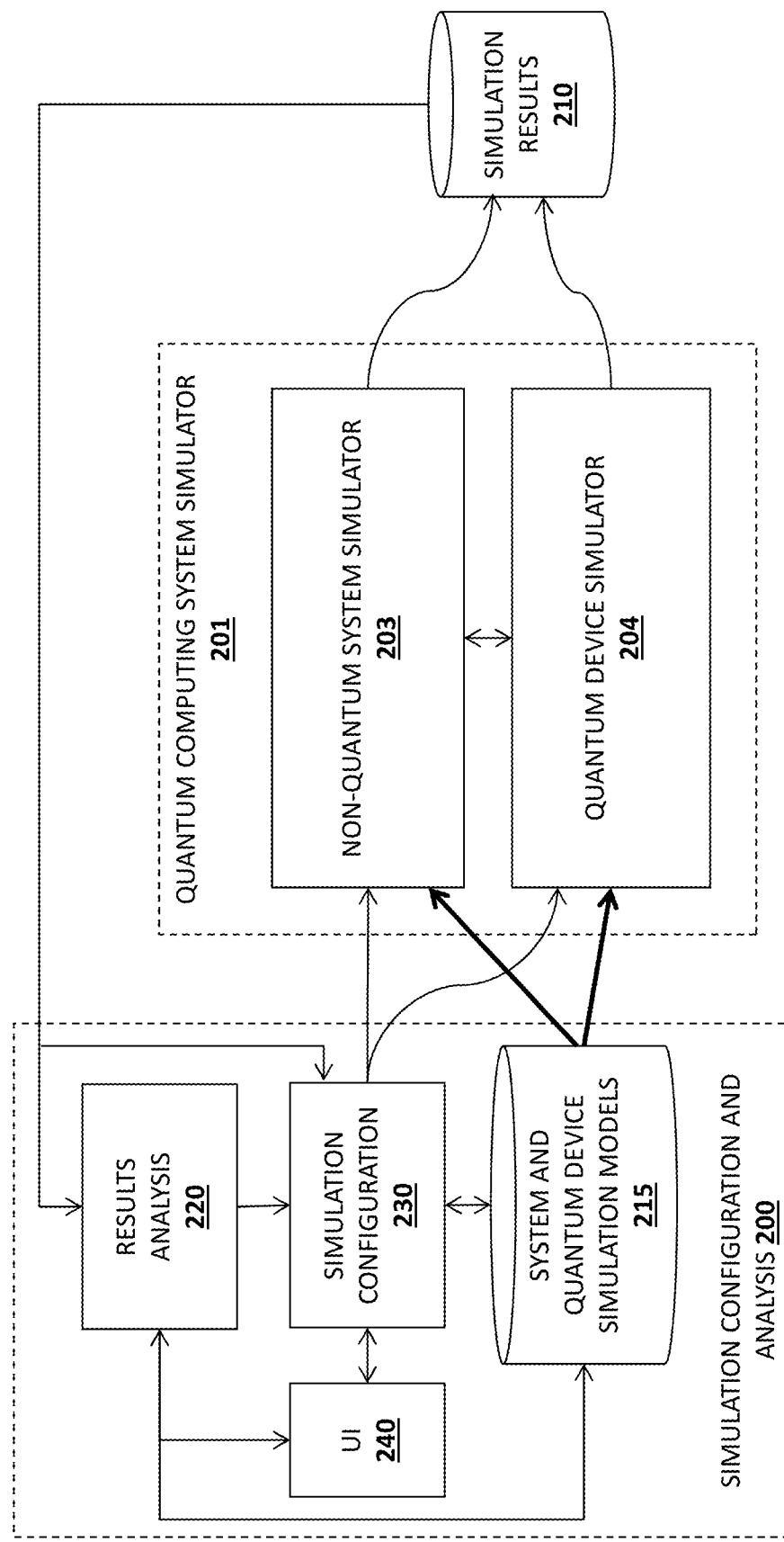
FIG. 2 illustrates an exemplary performance simulator comprising a non-quantum simulator and a quantum device simulator.

FIG. 2 illustrates one embodiment of a quantum computing system simulator 201 which includes a non-quantum system simulator 203 for simulating non-quantum components of the system and a quantum device simulator 204 for simulating qubit operations. On a real qubit system, logical operations processed in a non-quantum system are translated into corresponding sets of physical operations that are supported by the quantum processor, i.e., native quantum gates to perform qubit operations. In doing so, practicalities that influence system design and architecture are encountered. For example, one embodiment of the quantum computing system simulator 201 performs a simulation to determine whether the proposed qubit gates (e.g., as specified in QASM code) can be run on a particular quantum processor. If not, the simulator 201 determines a set of equivalent gates that can be run. In addition, the simulator 201 may identify quantum gates that can be run in parallel and the number of gates that can be run in series within a specified coherence budget. Further, one embodiment of the simulator 201 evaluates the data collection and storage capabilities during the algorithm run.

Mapping and scheduling the algorithm operations onto the qubit plane are difficult because most hardware is designed with limited qubit connectivity, placing constraints on the qubit operations that can be implemented. The algorithm needs to be mapped onto parts of the qubit plane that are capable of executing operations and sequenced into a schedule of operations that can be physically implemented (sometimes in parallel) in an optimal manner on the qubit plane. Mapping and scheduling is made more difficult because physical qubits are notoriously fragile and noisy, resulting in the need to create mapping and scheduling protocols that can adapt to these imperfections.

Returning to FIG. 2 one embodiment of the non-quantum system simulator 203 models the software and electronics from the compiler down to the classical control pulses that interact with the quantum device simulator 204 that simulates the Hamiltonians of few-qubit systems as well as the interface with classical control. Also illustrated in FIG. 2 is a simulation configuration and analysis platform 200, with a results analysis module 220 for analyzing and/or translating simulation results 210 and a simulation configuration module 230 for initializing the performance simulator 201 and performing subsequent configuration updates for subsequent iterations. A database of system and quantum device simulation models 215 may be compiled and continually updated for use by the simulation configuration module 230 and the system simulator 201.

In one embodiment, the system simulator 203 models all non-quantum components of the quantum system including (but not limited to) the qubit plane connectivity, control schemes, microcode, compiler, and programming languages, and even non-physical parameters such as cost per qubit. The simulation results 210 generated by the system simulator 210 provide an analysis of the quantum architecture.

In one embodiment, the results analysis module 220 evaluates and/or translates the simulation results which may be displayed for a user via a user interface 240 (e.g., a graphical user interface or graphical user interface). The simulation configuration module 230 may use the results of the analysis 220 (or the simulation results 210 directly) as well as the system and quantum device simulation models 215 to adjust the configuration of the system simulator 203 and/or quantum device simulator 204 for subsequent simulations. For example, in response to the simulation configuration 230, the system simulator 203 and quantum device simulator 204 may select and use certain system and quantum device simulation models 215 which specify the data and configuration variables to simulate a particular quantum computing stack with particular characteristics. The various simulation models 215 and associated data may be stored on a mass storage device, which may be continually updated as new system and quantum device simulation models are identified/created.

Although illustrated as separate entities, the simulation configuration and analysis module 200 and quantum computing system performance simulator 201 may be implemented on the same computing platform (e.g., the same workstation or server) or may be distributed across multiple different computing platforms.

In one embodiment, the simulation results 210 generated by the non-quantum system simulator 203 may be used to determine, for example, the layers of abstraction to be used between the qubit plane (simulated by quantum device simulator 204) and the user, the division between room temperature vs cryogenic control, and whether the qubit plane should be organized into specialized units (e.g., T-gate factories and EPR pair generators), or be monolithic. The simulation results 210 may also be used to identify and remove bottlenecks at the interfaces between computer layers. Once the simulation results 210 are processed by the results analysis module 220 and/or evaluated by the user, the simulation configuration module 230 may update the simulation (e.g., via the user interface 240). Any of the non-quantum and/or quantum variables described herein may be modified by the simulation configuration module 230, based on the simulation models 215, results generated by the analysis module 220, and/or the raw simulation results 210. Another simulation may then be executed to determine if the configuration modifications improved performance in view of any of the above-mentioned variables.

In one embodiment, the quantum device simulator 204 implements the Hamiltonian of a few qubits of the qubit plane. It takes as input device-level metrics from the quantum device simulation models 215 such as the coherence times, one and two-qubit gate fidelities, crosstalk, as well as the connectivity, and the control electronics that are used to perform the gates. Since a qubit is often an approximation for a multi-level quantum system, such a low-level simulator may involve extra levels in the quantum system that have perturbative but non-vanishing effects. They may also incorporate sources of noise such as charge-trapping defects for semiconductor dots.

The results analysis module 220 translates and/or evaluate the simulation results 210 generated by the quantum device simulator 203 and display the analyzed/translated results for the user via the user interface 240. The analyzed results may also be used to update the simulation configuration specified by the simulator configuration module 230 for subsequent simulations (e.g., in response to user input). The simulation configuration module 230 may also be configured to evaluate the raw simulation results 210 to perform its configuration operations.

By way of example, and not limitation, the simulation results 210 may be used by results analysis module 220 and/or simulation configuration module 230 to optimize multi-qubit gate designs, optimize implementation of common quantum computing kernels, design optimized error correcting schemes, pinpoint the most damaging sources of noise, debug quantum hardware, determine how much and the specific types of error correction which should be used, and the control schemes that are compatible with particular error corrections. This is especially relevant to limited control schemes where the number of control lines scales sub-linearly with the number of qubits. In addition, the simulation results 210 may be used to determine how to incorporate error-reduction techniques such as dynamical decoupling and post-selection into the control scheme.

Figure 3:
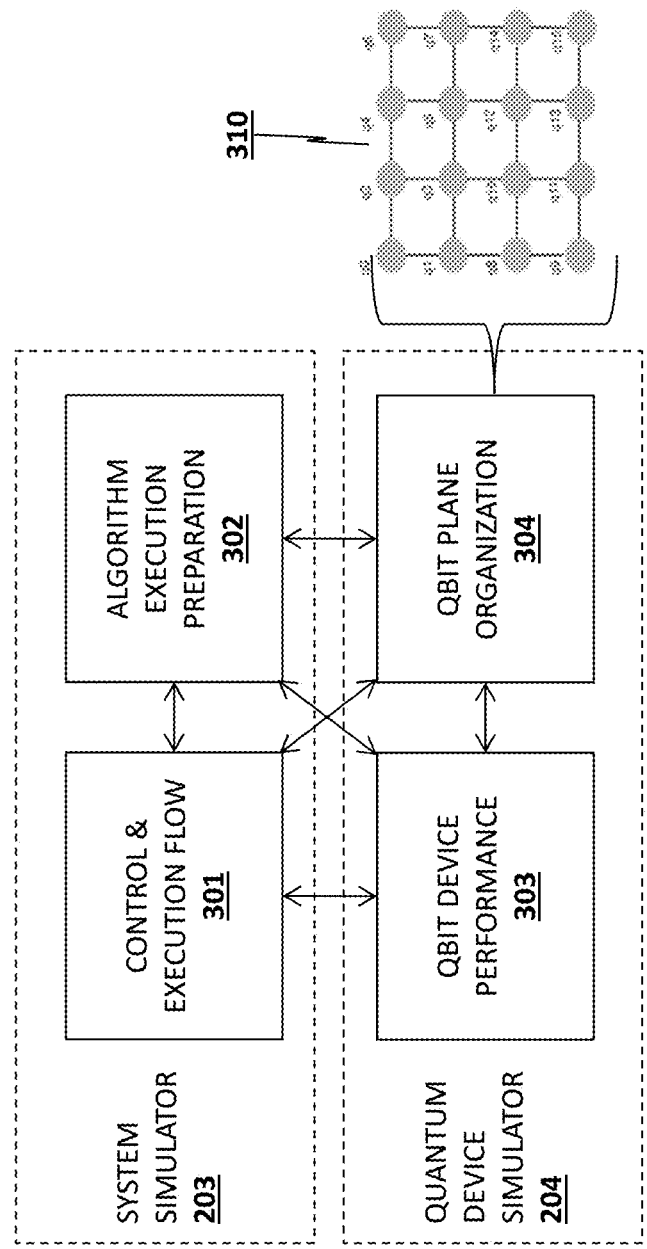
FIG. 3 illustrates additional details of a non-quantum simulator and quantum device simulator.

FIG. 3 illustrates additional details for one embodiment of the system simulator 203, including a control and execution flow component 301 and algorithm execution preparation component 302. In addition, the quantum device simulator 204 includes a set of components including a qubit device performance component 303 and a qubit plane organization component 304.

In one embodiment, the hardware control and execution flow component 301 simulates the parallelism and degree of individual qubit control afforded by the classical control electronics.

The qubit device performance component 303 simulates single qubit and two qubit gate fidelity, state preparation and measurement errors, T1 & T2* coherence times, and other device performance measurements required in the quantum system. These all influence the maximal executable circuit depth, fault tolerance approach, and other performance characteristics of the quantum system.

The qubit plane organization component 304 simulates the interconnectivity between the physical qubits 310. If the qubit plane provides nearest neighbor 2D planar connectivity between qubits it will be possible to implement topological error correction codes. If this degree of connectivity cannot be provided then a repetition code or some other error correcting code approach can be taken which will impact the amount of fault tolerance that the system can provide.

Numerous system designs are modeled in a system performance simulator, before actually building the hardware. In the case of quantum computing, creating a system performance simulator is a more computationally expensive simulation due to the need to model superposition and entanglement of qubits. In addition, the physics of the qubit plane 310 itself affects the functioning of the quantum computing system.

In one embodiment, a simplified Hamiltonian is constructed for the qubit plane 310 that, when incorporated into the qbit plane organization component 304 of the quantum device simulator 204, provides predictive power without exceeding the time and memory constraints of the simulation.

Figure 4A:
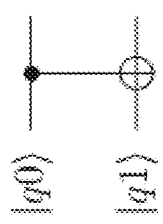
FIGS. 4A-C illustrate examples of a design choice implemented by a quantum computing simulator.
Figure 4B:
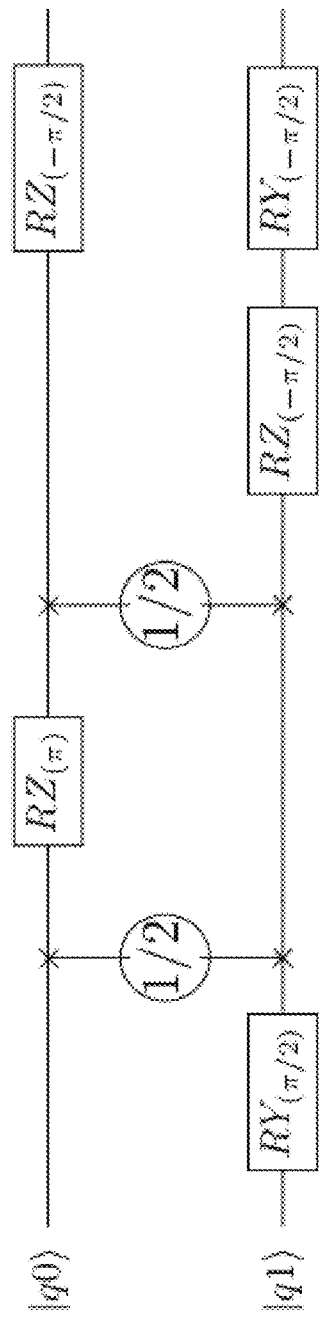
Figure 4C:
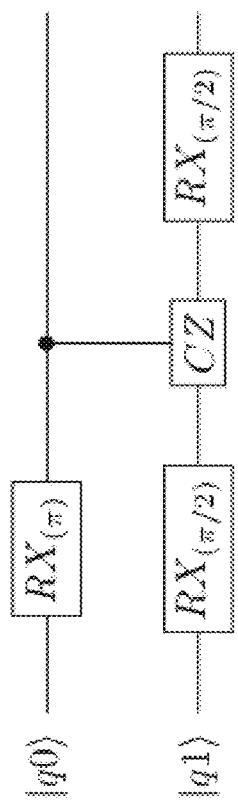

FIGS. 4A-C illustrate a design choice facilitated by a quantum computing system performance simulator 201 including different ways to decompose a logical CNOT gate into qubit operations and rotations. In particular, FIG. 4A illustrates a logical CNOT two qubit gate, FIG. 4B illustrates a logical CNOT implemented with a sqrt(SWAP) two qubit gate, and FIG. 4C illustrates a logical CNOT implemented with a CZ two qubit gate. Depending on the fidelity of the single and two qubit gates in these circuits, as well as their speed, the simulation results 210 may identify one particular implementation of the logical CNOT as the best option for the quantum system being simulated. For example, the results analysis module 220, upon evaluating the simulation results, may identify the CNOT gate in FIG. 4C as the most efficient choice, given all of the variables considered in the simulation. Alternatively, in one embodiment, the results analysis module 220 may determine that a different type of logical CNOT sequence would be preferable, based on the performance of the qubits available at that point in the execution of the algorithm. In this case, the results analysis module 220 may provide a recommendation for the different logical CNOT sequence.

The best choice for physical gate decomposition for the specific quantum system will depend on many things, including (but not limited to) qubit coherence times, gate fidelity and the efficiency of that particular gate operation on the choice of qubit system and qubit connectivity. Because the quantum computing system performance simulator 201 described herein models the entire quantum computing system, it is capable of providing guidance with design choices such as these.

In the above example, the performance simulator 201 is configured to choose the most efficient gate decomposition for a particular qubit system. In addition, because different qubit layouts and engineering constraints introduce restrictions, such as the number of control lines relative to the number of qubits and the parallelizability and selectivity for qubit operations, the simulation results can be used to perform better optimization of mapping and scheduling.

Figure 5:
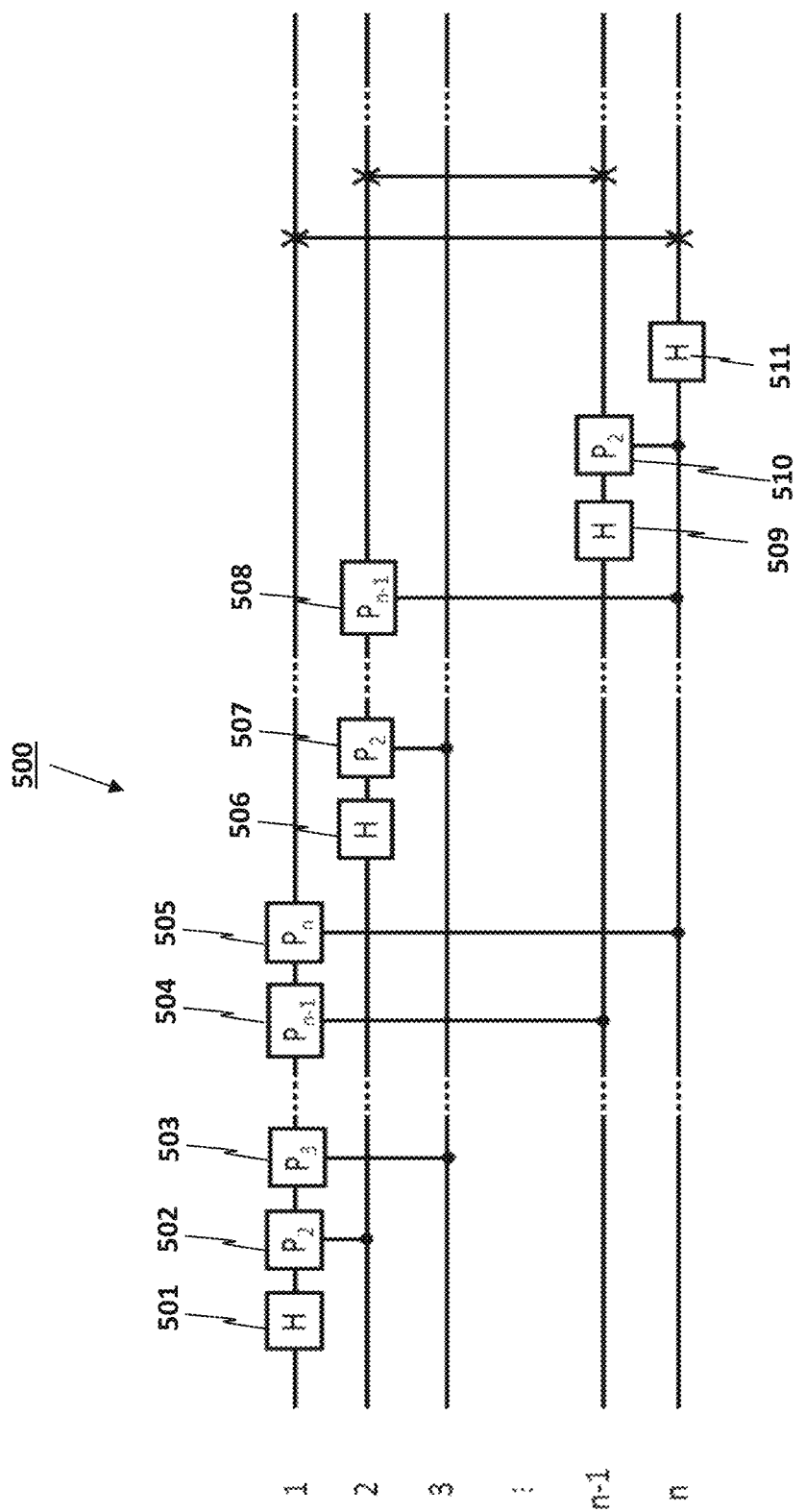
FIG. 5 illustrates a set of quantum gates for performing a fast Fourier transform.

FIG. 5 illustrates an example quantum algorithm 500 which includes a series of operations 201-211, such as rotations that can be performed on qubits 1-n. This particular example is a Fourier transform algorithm. Each line 0-n corresponds to a particular qubit and each box 501-511 represents an operation, with the chronological order of the operations represented from left to right.

Figure 6:
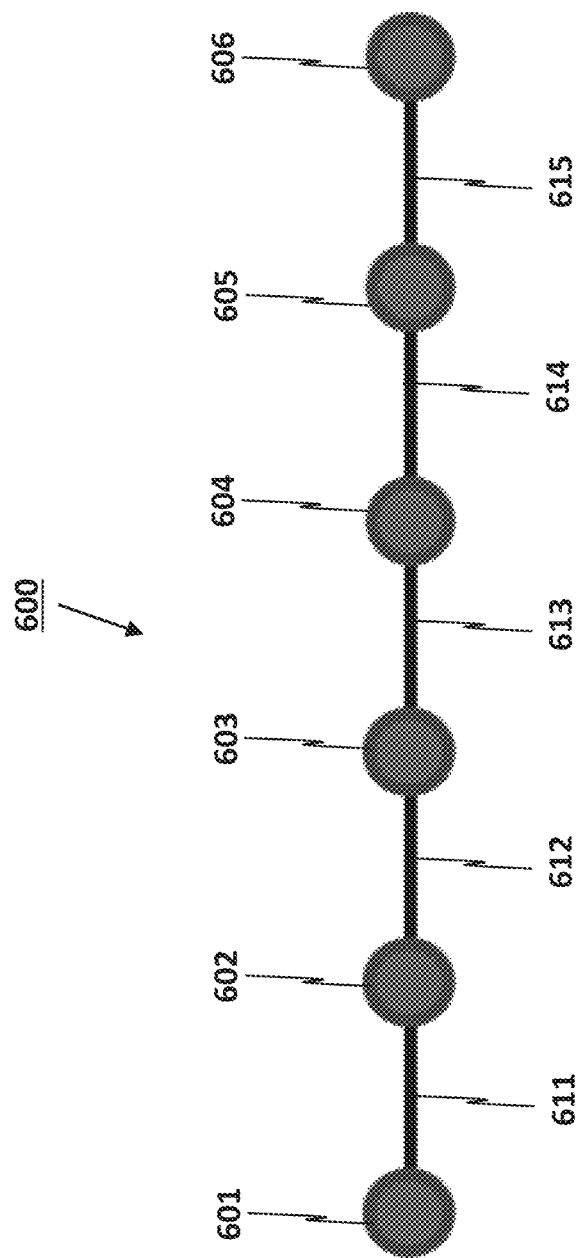
FIG. 6 illustrates an efficient arrangement of qubits selected by one embodiment of a quantum computing simulator.

FIG. 6 illustrates a linear array of qubits 600 which may implement the Fourier transform with nearest neighbor connectivity as a fully connected qubit system. Here, the circles 601-606 represent individual qubits, while the lines 611-615 indicate qubits between which two-qubit gates are possible.

When the circuit in FIG. 5 is executed on n qubits, the total number of gates in the QFT is $O(n^2)$. The O notation is used to classify algorithms according to how their running time or space requirements grow as the input size grows. However, the circuit depth, i.e., the longest path between algorithm input to output, can be seen to be $O(n)$ in the optimal case. Since the circuit involves interactions between all possible pairs of qubits, it would seem that only a high connectivity qubit plane would be able to achieve the lower bound on the circuit depth. A surprising result is that even a linear array of qubits as shown in FIG. 6 attains the lower bound scaling of the circuit depth for this algorithm.

A variety of different configuration options may be evaluated and included in the non-quantum system simulator 203 and quantum device simulator 204. Classical electronics for controlling quantum bits, as simulated by the system simulator 203, will be an integral part of any quantum computing system. Currently, even small qubit systems require racks of electronics for control of qubits and a corresponding number of wires into the ultra-high vacuum chamber to connect to the qubits. As qubit systems scale up, the increase in on-chip and I/O wiring causes thermal management issues, which are included in the simulations 203-204. In addition, current qubit hardware utilizes between 5-7 physical I/O cables for each qubit. This does not scale beyond a few tens of qubits before a larger custom dilution refrigerator was required. The problem of interconnect scalability at the qubit level as well as I/O scalability for qubit control is evaluated by the will be evaluated and used within the quantum device simulator 204. In addition, the result analysis module 220 may include this data when making configuration recommendations.

Figure 7:
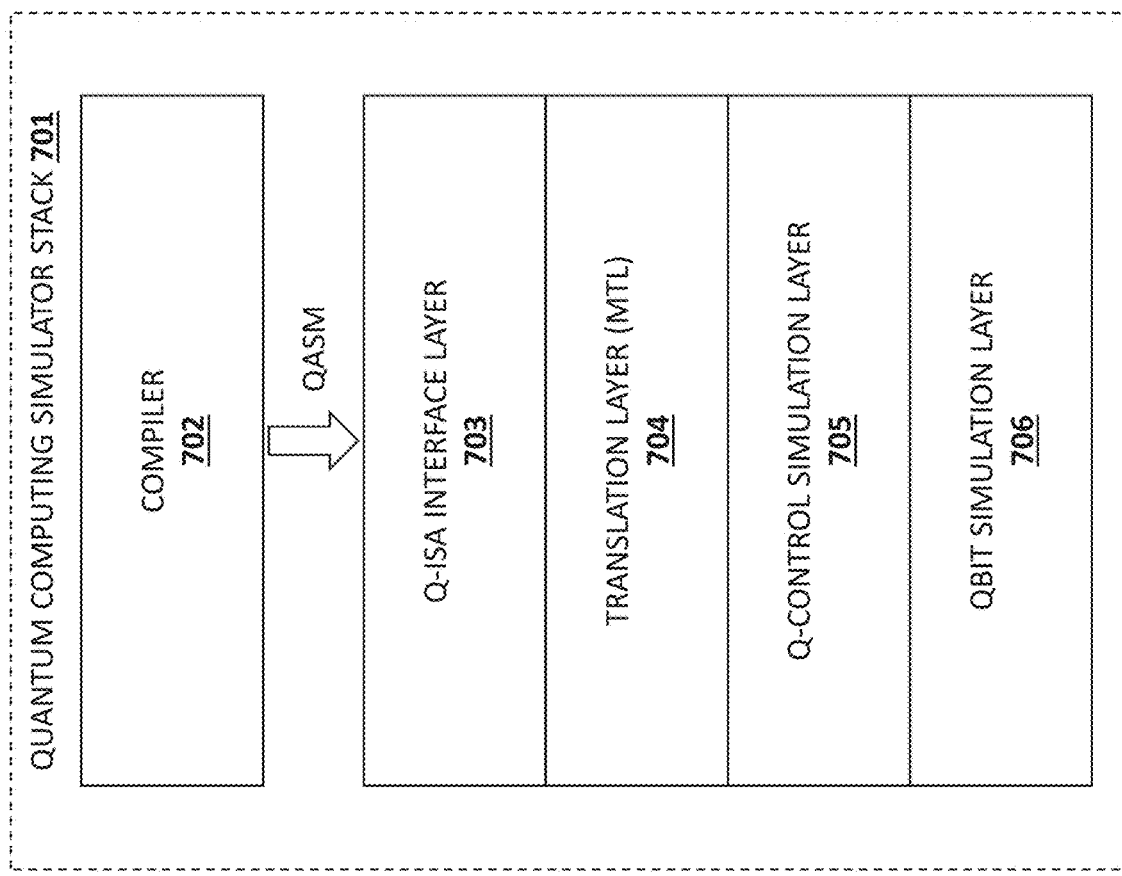
FIG. 7 illustrates one embodiment of a quantum computing simulator stack.

As illustrated in FIG. 7, In one embodiment, the quantum computing system performance simulation will provide a set of key metrics for hardware/software co-design. Currently, hardware/software co-design relies on analysis and optimization by hand, which becomes intractable in systems with a larger number of qubits. This capability is needed to create quantum computers with larger numbers of qubits.

FIG. 7 illustrates a quantum computing simulator stack 701 which includes a physical device simulation layer 706 and quantum control simulation layer 705 as well as a quantum ISA (Q-ISA) interface layer 703 and microcode translation layer 704. In one embodiment, the illustrated computing simulator stack 701 is capable of executing a real software workload such as Open Quantum Assembly Language (QASM) code generated by a real compiler 702.

Figure 8:
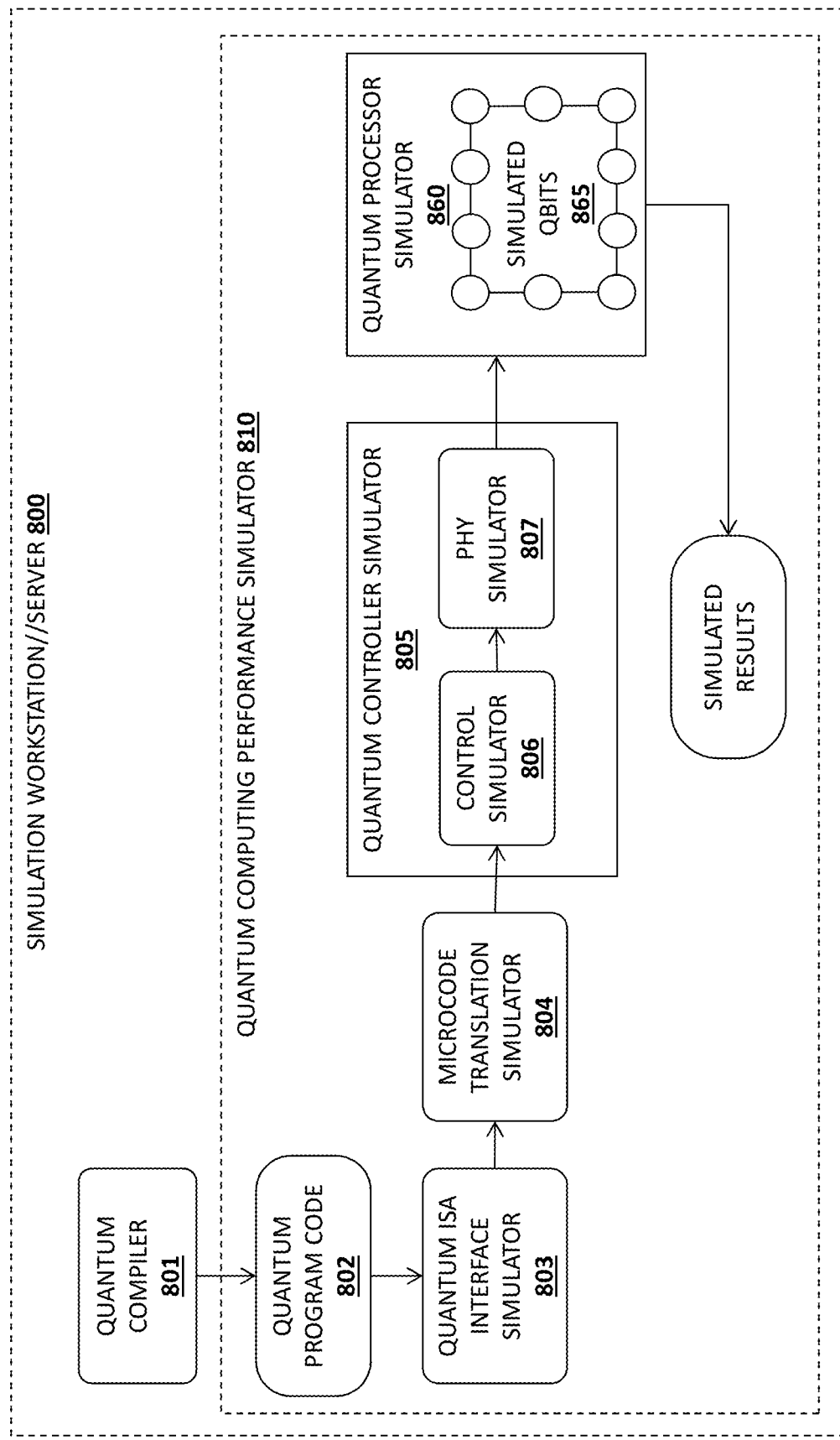
FIG. 8 illustrates another example of a quantum computing performance simulator.

FIG. 8 illustrates an exemplary embodiment of the invention implementing a quantum computer simulator stack. A simulator workstation or server 800 includes the hardware/software components required by the quantum computing performance simulator 810. A Q-ISA interface simulator 803 processes the quantum runtime program code 802 generated by the compiler 802 (e.g., quantum ISA instructions) for the microcode translation simulator 804 and responsively generates sequences of quantum micro-operations In one embodiment, the quantum micro-operations are quantum controller interface commands. A quantum controller simulator 805 includes a control simulator component 806 for executing the QC interface commands to control the operation of a PHY interface simulator component 807. For example, the PHY simulator component 207 performs a simulation of the electrical signals such as voltages, currents, radio frequency (RF), and/or microwave signals which would be generated to control qubit gates in a quantum computer. In response, a quantum processor simulator 860 simulates a set of qubits 865 controlled in response to the PHY simulator 207 output.

Thus, unlike system performance simulators for classical machines which also include circuit simulators, the quantum performance simulator described herein take into account the physics and layout of the qubits themselves, as well as the physical qubit control components. This approach is necessary to create a system performance simulator for a quantum computing system because the physics of the quantum bits and their interactions determine many of the system parameters, such as clock cycle, control approach, micro-instruction set, etc.

Figure 9:
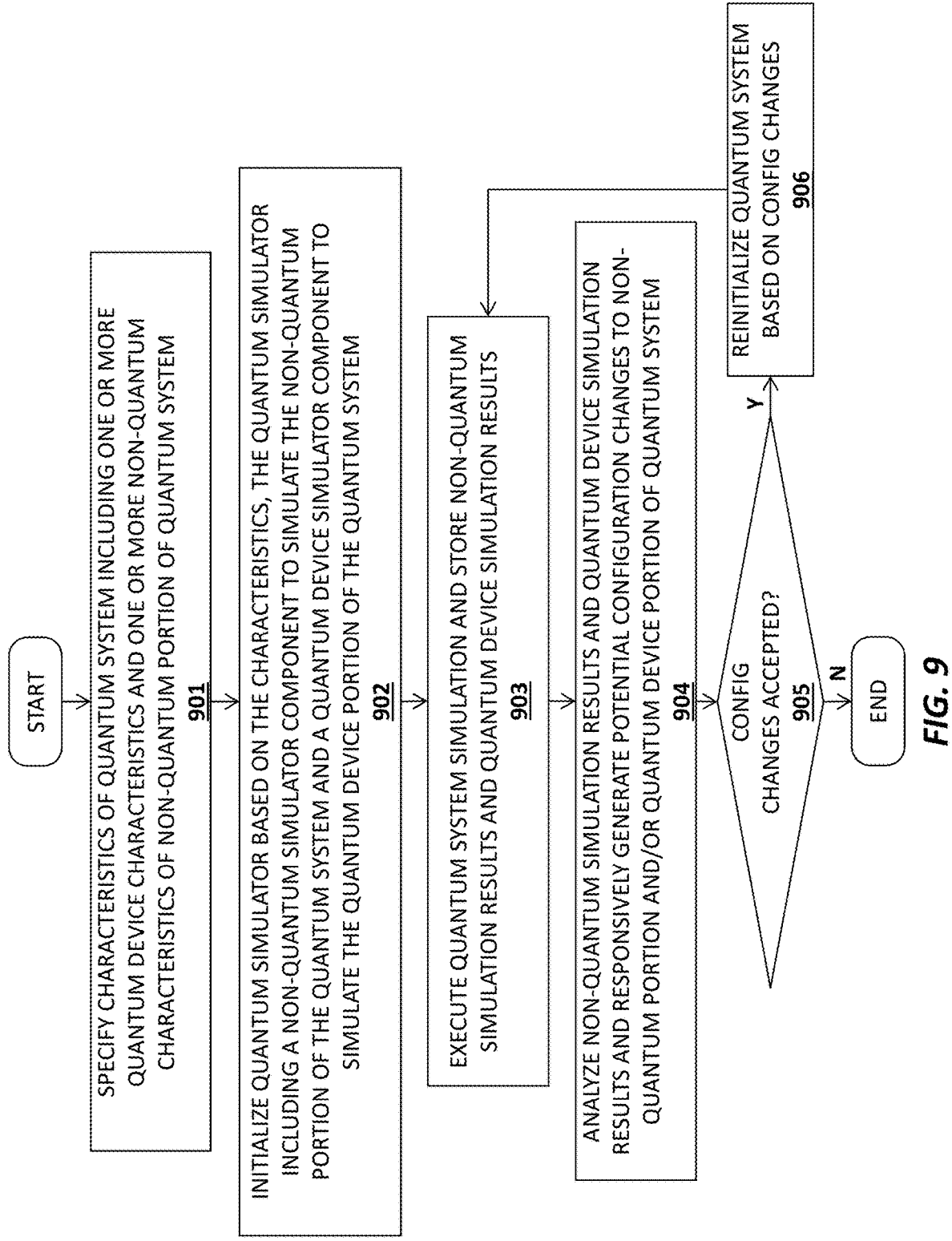
FIG. 9 illustrates one embodiment of a method for a quantum computing simulation.

A process in accordance with one embodiment of the invention is illustrated in FIG. 9. The process may be implemented within the context of the system architectures described above, but is not limited to any particular quantum system architecture.

At 901, characteristics of the quantum system are identified including quantum device characteristics and non-quantum characteristics. For example, the number of quantum bits (qubits) in the quantum processor and the possible interconnections between those qubits in the quantum plane may be specified. In addition, features of the physical quantum controller and/or the quantum runtime may be specified. In one embodiment, the characteristics may be identified as being modifiable or static (not modifiable). If the simulation is being done with a particular quantum processor in mind, for example, the number of qubits and the interconnections between them are unmodifiable.

At 902, the quantum simulator is initialized based on the characteristics. In one embodiment, this involves initializing a non-quantum simulator to simulate a non-quantum portion of the quantum system and initializing a quantum device simulator to simulate a quantum device portion of the quantum system.

At 903, the quantum system simulation is executed. Quantum device simulation results and non-quantum simulation results are stored.

At 904, the non-quantum simulation results and quantum device simulation results are analyzed. A result of the analysis may be one or more potential/recommended configuration changes to the non-quantum portion and/or the quantum device portion of the quantum system. For example, if the simulation was initially run using the set of quantum gates shown in FIG. 4B, the recommendation may be to run the simulation with the set of quantum gates shown in FIG. 4C. If such configuration changes are accepted, determined at 905, then the quantum system is reinitialized based on the configuration changes at 906 and the quantum system simulation is re-executed at 903.

EXAMPLES

The following are example implementations of different embodiments of the invention.

Example 1

A machine-readable medium having program code stored thereon which, when executed by a machine, causes the machine to perform the operations of: initializing a quantum computing system simulator for simulating multiple layers of a quantum system including one or more non-quantum layers and one or more physical quantum device layers of the quantum system; simulating a first set of operations of the one or more non-quantum layers of the quantum system to generate first simulation results; simulating a second set of operations of the one or more quantum device layers of the quantum system to generate second simulation results; analyzing the first and second simulation results to provide at least one configuration recommendation for the quantum system.

Example 2

The machine-readable medium of Example 1 wherein the non-quantum layers comprise a first layer to process quantum runtime program code, a second layer to translate the quantum runtime program code into a plurality of operations, and a third layer to execute the plurality of operations to control the one or more physical quantum devices at the quantum device layer.

Example 3

The machine-readable medium of Example 2 wherein the one or more physical quantum device layers comprise a quantum processor comprising a plurality of quantum bits (qubits), wherein simulation of the second set of operations include simulating the one or more operations performed on the qubits.

Example 4

The machine-readable medium of Example 1 further comprising: re-initializing the quantum computing system simulator in accordance with the at least one configuration recommendation; simulating a third set of operations of the one or more non-quantum layers of the quantum system to generate third simulation results; simulating a fourth set of operations of the one or more quantum device layers of the quantum system to generate fourth simulation results; comparing the first simulation results with the third simulation results and comparing the second simulation results with the fourth simulation results to generate a second configuration recommendation for the quantum system.

Example 5

The machine-readable medium of Example 4 wherein the one or more physical quantum device layers are static, and wherein the at least one configuration recommendation comprises a recommended modification to one or more of the non-quantum layers.

Example 6

The machine-readable medium of Example 1 wherein the one or more non-quantum layers comprise an algorithm execution preparation layer and a hardware control and execution flow layer, wherein an algorithm execution preparation simulator for the algorithm execution preparation layer simulates resources that must be allocated to compiling and scheduling a sequence of quantum gates to run on a specific qubit device technology and a particular qubit plane organization.

Example 7

The machine-readable medium of Example 6 wherein a hardware control and execution flow simulator for the hardware control and execution flow layer simulates parallelism and degree of individual qubit control afforded by available control electronics.

Example 8

The machine-readable medium of Example 1 wherein the one or more physical quantum device layers of the quantum system are simulated by a qubit device performance simulator which simulates single qubit and two qubit gate fidelity, state preparation and measurement errors, coherence times, and/or device performance measurements required in the quantum system.

Example 9

The machine-readable medium of Example 8 wherein the one or more physical quantum device layers of the quantum system are further simulated by a qubit plane organization simulator to simulate interconnectivity between physical qubits in a quantum processor.

Example 10

A method comprising: initializing a quantum computing system simulator for simulating multiple layers of a quantum system including one or more non-quantum layers and one or more physical quantum device layers of the quantum system; simulating a first set of operations of the one or more non-quantum layers of the quantum system to generate first simulation results; simulating a second set of operations of the one or more quantum device layers of the quantum system to generate second simulation results; analyzing the first and second simulation results to provide at least one configuration recommendation for the quantum system.

Example 11

The method of Example 10 wherein the non-quantum layers comprise a first layer to process quantum runtime program code, a second layer to translate the quantum runtime program code into a plurality of operations, and a third layer to execute the plurality of operations to control the one or more physical quantum devices at the quantum device layer.

Example 12

The method of Example 11 wherein the one or more physical quantum device layers comprise a quantum processor comprising a plurality of quantum bits (qubits), wherein simulation of the second set of operations include simulating the one or more operations performed on the qubits.

Example 13

The method of Example 10 further comprising program code to cause the machine to perform the additional operations of: re-initializing the quantum computing system simulator in accordance with the at least one configuration recommendation; simulating a third set of operations of the one or more non-quantum layers of the quantum system to generate third simulation results; simulating a fourth set of operations of the one or more quantum device layers of the quantum system to generate fourth simulation results; comparing the first simulation results with the third simulation results and comparing the second simulation results with the fourth simulation results to generate a second configuration recommendation for the quantum system.

Example 14

The method of Example 13 wherein the one or more physical quantum device layers are static, and wherein the at least one configuration recommendation comprises a recommended modification to one or more of the non-quantum layers.

Example 15

The method of Example 10 wherein the one or more non-quantum layers comprise an algorithm execution preparation layer and a hardware control and execution flow layer, wherein an algorithm execution preparation simulator for the algorithm execution preparation layer simulates resources that must be allocated to compiling and scheduling a sequence of quantum gates to run on a specific qubit device technology and a particular qubit plane organization.

Example 16

The method of Example 15 wherein a hardware control and execution flow simulator for the hardware control and execution flow layer simulates parallelism and degree of individual qubit control afforded by available control electronics.

Example 17

The method of Example 10 wherein the one or more physical quantum device layers of the quantum system are simulated by a qubit device performance simulator which simulates single qubit and two qubit gate fidelity, state preparation and measurement errors, coherence times, and/or device performance measurements required in the quantum system.

Example 18

The method of Example 17 wherein the one or more physical quantum device layers of the quantum system are further simulated by a qubit plane organization simulator to simulate interconnectivity between physical qubits in a quantum processor.

Example 19

A system comprising: a quantum simulation configurator to initialize a quantum computing system simulator for simulating multiple layers of a quantum system including one or more non-quantum layers and one or more physical quantum device layers of the quantum system; a first set of one or more simulators to simulate a first set of operations of the one or more non-quantum layers of the quantum system to generate first simulation results; a second set of one or more simulators to simulate a second set of operations of the one or more quantum device layers of the quantum system to generate second simulation results; a results analyzer to analyze the first and second simulation results to provide at least one configuration recommendation for the quantum system.

Example 20

The system of Example 19 wherein the non-quantum layers comprise a first layer to process quantum runtime program code, a second layer to translate the quantum runtime program code into a plurality of operations, and a third layer to execute the plurality of operations to control the one or more physical quantum devices at the quantum device layer.

Example 21

The system of Example 20 wherein the one or more physical quantum device layers comprise a quantum processor comprising a plurality of quantum bits (qubits), wherein simulation of the second set of operations include simulating the one or more operations performed on the qubits.

Example 22

The system of Example 19 wherein the quantum computing simulator is to be re-initialized in accordance with the at least one configuration recommendation, and wherein the first set of one or more simulators are to simulate a third set of operations of the one or more non-quantum layers of the quantum system to generate third simulation results and the second set of one or more simulators are to simulate a fourth set of operations of the one or more quantum device layers of the quantum system to generate fourth simulation results; the analyzer to compare the first simulation results with the third simulation results and compare the second simulation results with the fourth simulation results to generate a second configuration recommendation for the quantum system.

Example 23

The system of Example 22 wherein the one or more physical quantum device layers are static, and wherein the at least one configuration recommendation comprises a recommended modification to one or more of the non-quantum layers.

Example 24

The system of Example 19 wherein the one or more non-quantum layers comprise an algorithm execution preparation layer and a hardware control and execution flow layer, wherein an algorithm execution preparation simulator for the algorithm execution preparation layer simulates resources that must be allocated to compiling and scheduling a sequence of quantum gates to run on a specific qubit device technology and a particular qubit plane organization.

Example 25

The system of Example 24 wherein a hardware control and execution flow simulator for the hardware control and execution flow layer simulates parallelism and degree of individual qubit control afforded by available control electronics.

Example 26

The system of Example 19 wherein the one or more physical quantum device layers of the quantum system are simulated by a qubit device performance simulator which simulates single qubit and two qubit gate fidelity, state preparation and measurement errors, coherence times, and/or device performance measurements required in the quantum system.

Example 27

The system of Example 26 wherein the one or more physical quantum device layers of the quantum system are further simulated by a qubit plane organization simulator to simulate interconnectivity between physical qubits in a quantum processor.

In the above detailed description, reference is made to the accompanying drawings that form a part hereof, and in which is shown, by way of illustration, embodiments that may be practiced. It is to be understood that other embodiments may be utilized and structural or logical changes may be made without departing from the scope of the present disclosure. Therefore, the following detailed description is not to be taken in a limiting sense.

Various operations may be described as multiple discrete actions or operations in turn in a manner that is most helpful in understanding the claimed subject matter. However, the order of description should not be construed as to imply that these operations are necessarily order dependent. In particular, these operations may not be performed in the order of presentation. Operations described may be performed in a different order from the described embodiment. Various additional operations may be performed, and/or described operations may be omitted in additional embodiments. Terms like "first," "second," "third," etc. do not imply a particular ordering, unless otherwise specified.

For the purposes of the present disclosure, the phrase "A and/or B" means (A), (B), or (A and B). For the purposes of the present disclosure, the phrase "A, B, and/or C" means (A), (B), (C), (A and B), (A and C), (B and C), or (A, B, and C). The term "between," when used with reference to measurement ranges, is inclusive of the ends of the measurement ranges. As used herein, the notation "A/B/C" means (A), (B), and/or (C).

The description uses the phrases "in an embodiment" or "in embodiments," which may each refer to one or more of the same or different embodiments. Furthermore, the terms "comprising," "including," "having," and the like, as used with respect to embodiments of the present disclosure, are synonymous.

Embodiments of the invention may include various steps, which have been described above. The steps may be embodied in machine-executable instructions which may be used to cause a general-purpose or special-purpose processor to perform the steps. Alternatively, these steps may be performed by specific hardware components that contain hard-wired logic for performing the steps, or by any combination of programmed computer components and custom hardware components.

As described herein, instructions may refer to specific configurations of hardware such as application specific integrated circuits (ASICs) configured to perform certain operations or having a predetermined functionality or software instructions stored in memory embodied in a non-transitory computer readable medium. Thus, the techniques shown in the figures can be implemented using code and data stored and executed on one or more electronic devices (e.g., an end station, a network element, etc.). Such electronic devices store and communicate (internally and/or with other electronic devices over a network) code and data using computer machine-readable media, such as non-transitory computer machine-readable storage media (e.g., magnetic disks; optical disks; random access memory; read only memory; flash memory devices; phase-change memory) and transitory computer machine-readable communication media (e.g., electrical, optical, acoustical or other form of propagated signals—such as carrier waves, infrared signals, digital signals, etc.).

In addition, such electronic devices typically include a set of one or more processors coupled to one or more other components, such as one or more storage devices (non-transitory machine-readable storage media), user input/output devices (e.g., a keyboard, a touchscreen, and/or a display), and network connections. The coupling of the set of processors and other components is typically through one or more busses and bridges (also termed as bus controllers). The storage device and signals carrying the network traffic respectively represent one or more machine-readable storage media and machine-readable communication media. Thus, the storage device of a given electronic device typically stores code and/or data for execution on the set of one or more processors of that electronic device. Of course, one or more parts of an embodiment of the invention may be implemented using different combinations of software, firmware, and/or hardware. Throughout this detailed description, for the purposes of explanation, numerous specific details were set forth in order to provide a thorough understanding of the present invention. It will be apparent, however, to one skilled in the art that the invention may be practiced without some of these specific details. In certain instances, well known structures and functions were not described in elaborate detail in order to avoid obscuring the subject matter of the present invention. Accordingly, the scope and spirit of the invention should be judged in terms of the claims which follow.

What is claimed is:

1. A non-transitory machine-readable medium having program code stored thereon which, when executed by a machine, causes the machine to perform operations of:
   initializing a quantum computing system simulator for simulating multiple layers of a quantum system including one or more non-quantum layers and one or more physical quantum device layers of the quantum system;
   simulating a first set of operations of the one or more non-quantum layers of the quantum system to generate first simulation results;
   simulating a second set of operations of the one or more quantum device layers of the quantum system to generate second simulation results; and
   analyzing the first and second simulation results to provide at least one configuration recommendation for the quantum system.

2. The non-transitory machine-readable medium of claim 1 wherein the non-quantum layers comprise a first layer to process quantum runtime program code, a second layer to translate the quantum runtime program code into a plurality of operations, and a third layer to execute the plurality of operations to control the one or more physical quantum devices at the quantum device layer.

3. The non-transitory machine-readable medium of claim 2 wherein the one or more physical quantum device layers comprise a quantum processor comprising a plurality of quantum bits (qubits), wherein simulation of the second set of operations include simulating the one or more operations performed on the qubits.

4. The non-transitory machine-readable medium of claim 1 further comprising:
   re-initializing the quantum computing system simulator in accordance with the at least one configuration recommendation;
   simulating a third set of operations of the one or more non-quantum layers of the quantum system to generate third simulation results;
   simulating a fourth set of operations of the one or more quantum device layers of the quantum system to generate fourth simulation results; and
   comparing the first simulation results with the third simulation results and comparing the second simulation results with the fourth simulation results to generate a second configuration recommendation for the quantum system.

5. The non-transitory machine-readable medium of claim 4 wherein the one or more physical quantum device layers are static, and wherein the at least one configuration recommendation comprises a recommended modification to one or more of the non-quantum layers.

6. The non-transitory machine-readable medium of claim 1 wherein the one or more non-quantum layers comprise an algorithm execution preparation layer and a hardware control and execution flow layer, wherein an algorithm execution preparation simulator for the algorithm execution preparation layer simulates resources that must be allocated to compiling and scheduling a sequence of quantum gates to run on a specific qubit device technology and a particular qubit plane organization.

7. The non-transitory machine-readable medium of claim 6 wherein a hardware control and execution flow simulator for the hardware control and execution flow layer simulates parallelism and degree of individual qubit control afforded by available control electronics.

8. The non-transitory machine-readable medium of claim 1 wherein the one or more physical quantum device layers of the quantum system are simulated by a qubit device performance simulator which simulates single qubit and two qubit gate fidelity, state preparation and measurement errors, coherence times, and/or device performance measurements required in the quantum system.

9. The non-transitory machine-readable medium of claim 8 wherein the one or more physical quantum device layers of the quantum system are further simulated by a qubit plane organization simulator to simulate interconnectivity between physical qubits in a quantum processor.

10. A method comprising:
    initializing a quantum computing system simulator for simulating multiple layers of a quantum system including one or more non-quantum layers and one or more physical quantum device layers of the quantum system;
    simulating a first set of operations of the one or more non-quantum layers of the quantum system to generate first simulation results;
    simulating a second set of operations of the one or more quantum device layers of the quantum system to generate second simulation results; and
    analyzing the first and second simulation results to provide at least one configuration recommendation for the quantum system.

11. The method of claim 10 wherein the non-quantum layers comprise a first layer to process quantum runtime program code, a second layer to translate the quantum runtime program code into a plurality of operations, and a third layer to execute the plurality of operations to control the one or more physical quantum devices at the quantum device layer.

12. The method of claim 11 wherein the one or more physical quantum device layers comprise a quantum processor comprising a plurality of quantum bits (qubits), wherein simulation of the second set of operations include simulating the one or more operations performed on the qubits.

13. The method of claim 10 further comprising program code to cause the machine to perform the additional operations of:
    re-initializing the quantum computing system simulator in accordance with the at least one configuration recommendation;
    simulating a third set of operations of the one or more non-quantum layers of the quantum system to generate third simulation results;
    simulating a fourth set of operations of the one or more quantum device layers of the quantum system to generate fourth simulation results; and
    comparing the first simulation results with the third simulation results and comparing the second simulation results with the fourth simulation results to generate a second configuration recommendation for the quantum system.

14. The method of claim 13 wherein the one or more physical quantum device layers are static, and wherein the at least one configuration recommendation comprises a recommended modification to one or more of the non-quantum layers.

15. The method of claim 10 wherein the one or more non-quantum layers comprise an algorithm execution preparation layer and a hardware control and execution flow layer, wherein an algorithm execution preparation simulator for the algorithm execution preparation layer simulates resources that must be allocated to compiling and scheduling a sequence of quantum gates to run on a specific qubit device technology and a particular qubit plane organization.

16. The method of claim 15 wherein a hardware control and execution flow simulator for the hardware control and execution flow layer simulates parallelism and degree of individual qubit control afforded by available control electronics.

17. The method of claim 10 wherein the one or more physical quantum device layers of the quantum system are simulated by a qubit device performance simulator which simulates single qubit and two qubit gate fidelity, state preparation and measurement errors, coherence times, and/or device performance measurements required in the quantum system.

18. The method of claim 17 wherein the one or more physical quantum device layers of the quantum system are further simulated by a qubit plane organization simulator to simulate interconnectivity between physical qubits in a quantum processor.

19. A system comprising:
quantum simulation configurator circuitry to initialize a quantum computing system simulator for simulating multiple layers of a quantum system including one or more non-quantum layers and one or more physical quantum device layers of the quantum system;
a first set of one or more simulator circuitries to simulate a first set of operations of the one or more non-quantum layers of the quantum system to generate first simulation results;
a second set of one or more simulator circuitries to simulate a second set of operations of the one or more quantum device layers of the quantum system to generate second simulation results; and
results analyzer circuitry to analyze the first and second simulation results to provide at least one configuration recommendation for the quantum system.

20. The system of claim 19 wherein the non-quantum layers comprise a first layer to process quantum runtime program code, a second layer to translate the quantum runtime program code into a plurality of operations, and a third layer to execute the plurality of operations to control the one or more physical quantum devices at the quantum device layer.

21. The system of claim 20 wherein the one or more physical quantum device layers comprise a quantum processor comprising a plurality of quantum bits (qubits), wherein simulation of the second set of operations include simulating the one or more operations performed on the qubits.

22. The system of claim 19 wherein the quantum computing simulator is re-initialized in accordance with the at least one configuration recommendation, and wherein the first set of one or more simulator circuitries are to simulate a third set of operations of the one or more non-quantum layers of the quantum system to generate third simulation results and the second set of one or more simulator circuitries are to simulate a fourth set of operations of the one or more quantum device layers of the quantum system to generate fourth simulation results; and
the results analyzer circuitry is to compare the first simulation results with the third simulation results and compare the second simulation results with the fourth simulation results to generate a second configuration recommendation for the quantum system.

23. The system of claim 22 wherein the one or more physical quantum device layers are static, and wherein the at least one configuration recommendation comprises a recommended modification to one or more of the non-quantum layers.

24. The system of claim 19 wherein the one or more non-quantum layers comprise an algorithm execution preparation layer and a hardware control and execution flow layer, wherein an algorithm execution preparation simulator for the algorithm execution preparation layer simulates resources that must be allocated to compiling and scheduling a sequence of quantum gates to run on a specific qubit device technology and a particular qubit plane organization.

25. The system of claim 24 wherein a hardware control and execution flow simulator for the hardware control and execution flow layer simulates parallelism and degree of individual qubit control afforded by available control electronics.

26. The system of claim 19 wherein the one or more physical quantum device layers of the quantum system are simulated by a qubit device performance simulator which simulates single qubit and two qubit gate fidelity, state preparation and measurement errors, coherence times, and/or device performance measurements required in the quantum system.

27. The system of claim 26 wherein the one or more physical quantum device layers of the quantum system are further simulated by qubit plane organization simulator circuitry to simulate interconnectivity between physical qubits in a quantum processor.

\* \* \* \* \*